United States Patent
Bleukx et al.

(10) Patent No.: US 8,482,949 B2
(45) Date of Patent: Jul. 9, 2013

(54) METHOD TO DRIVE A HIGH-VOLTAGE TUBE GRID

(75) Inventors: Marc Maria Alex Bleukx, Mechelen (BE); Christoph Leof, Aachen (DE); Rainer Pietig, Herzogenrath (DE)

(73) Assignee: Koninklijke Philips N.V., Eindhoven (NL)

( * ) Notice: Subject to any disclaimer, the term of this patent is extended or adjusted under 35 U.S.C. 154(b) by 825 days.

(21) Appl. No.: 12/526,641

(22) PCT Filed: Feb. 11, 2008

(86) PCT No.: PCT/IB2008/050486
§ 371 (c)(1),
(2), (4) Date: Aug. 11, 2009

(87) PCT Pub. No.: WO2008/099328
PCT Pub. Date: Aug. 21, 2008

(65) Prior Publication Data
US 2010/0038973 A1   Feb. 18, 2010

(30) Foreign Application Priority Data
Feb. 15, 2007 (EP) .................................. 07102470

(51) Int. Cl.
H02M 7/5387     (2007.01)
(52) U.S. Cl.
USPC ......................................................... 363/132
(58) Field of Classification Search
USPC .... 323/222–224; 320/166; 363/132; 307/115
See application file for complete search history.

(56) References Cited

U.S. PATENT DOCUMENTS
5,654,728 A * 8/1997 Kanazawa et al. ......... 315/169.4
(Continued)

FOREIGN PATENT DOCUMENTS
KR   20040016020   2/2004
WO   WO0217278    2/2002

OTHER PUBLICATIONS
Wang, Shengpei, et al, "Discrete Pulse Modulated High-Frequency Soft-Switching Inverter and Its New Application", IEEE 1999 International Conference on Power Electronics and Drive Systems, PEDS '99, Jul. 1999, Hong Kong, pp. 990-995.

(Continued)

Primary Examiner — Jue Zhang

(57) ABSTRACT

A method and device for operating a device for high-voltage switching for driving capacitive loads, having a first and a second input terminal (11, 12) for applying a high voltage supply, such that a higher potential of the high-voltage supply may be applied to the first input terminal (11) and a lower potential may be applied to the second input terminal (12); a first and a second switch (S1, S2), connected in series between the first and the second input terminal (11, 12); a first and a second clamping diode (D3, D4), connected in series and in the same blocking direction between the first input terminal and the second input terminal, such that the first second clamping diode block with respect to the applied high voltage; a storage inductor Ls, which is connected with one of its terminals to a connecting point (13) of the both switches and with another terminal to a connecting point (14) of the both clamping diodes; and an output terminal (15) for connecting a capacitive load Cl, which output terminal is connected with the connecting point (14) of the both clamping diodes (D3, D4). The method comprises starting with both switches (S1, S2) open; closing of the first switch (S1) after a first predetermined time; opening (ST3) of the first switch (S1) after a second predetermined time; closing (ST4) of the second switch (S2), after arriving a zero voltage over the second switch.

26 Claims, 6 Drawing Sheets

U.S. PATENT DOCUMENTS

| | | | |
|---|---|---|---|
| 5,835,371 A | 11/1998 | Kume et al. | |
| 6,324,080 B1 * | 11/2001 | Laeuffer | 363/132 |
| 6,366,063 B1 * | 4/2002 | Sekii | 323/223 |
| 6,853,570 B2 | 2/2005 | De Vries | |
| 7,916,837 B2 | 3/2011 | Krzystyniak et al. | |
| 2002/0041275 A1 * | 4/2002 | Mccormack | 345/204 |
| 2006/0044856 A1 | 3/2006 | Bird et al. | |
| 2008/0198634 A1 * | 8/2008 | Scheel et al. | 363/21.02 |
| 2011/0235785 A1 | 9/2011 | Behling | |

OTHER PUBLICATIONS

Yonemori, H., et al., "Advanced Soft-Switching Sinewave PWM High-Frequencye Inverter-Link Cycloconverter Incorporating Voltage-Clamped Quasi-Resonant and Capacitative Snubber Techniques", Conference Record of the 1991 IEEE Industry Applications Society Annual Meeting in Dearborn, MI, USA, Sep. 28 through Oct. 4, 1991, pp. 795-802.

* cited by examiner

METHOD TO DRIVE A HIGH-VOLTAGE TUBE GRID

FIELD OF THE INVENTION

The present invention relates to a device and a method for driving a capacitive load in high-voltage generators, and in particular to a device and a method for driving a capacitive load in high-voltage generators using the principle of zero voltage switching.

BACKGROUND OF THE INVENTION

Modern high power x-ray tubes for CV Cardio Vascular and CT (computer tomography) applications are rotating anode tubes. Here an accelerated electron beam hits a rotating anode disc, which generates x-ray photons. Typically the electrons are emitted from a thermal emitter, i.e. the total emission current and thus the total x-ray power depends on the emitter temperature. For a given acceleration voltage, which is given by the required type of examination, the x-ray output and thus the x-ray dose given to the patient can only be changed by changing the emitter temperature. This is done in modern CT-scanners, where the dose is adjusted according to the elliptical shape of the patient cross section. Unfortunately only a relatively small modulation depth can be obtained, since the thermal cycling of the emitter is slow due to its large heat capacity. Another method to implement dose modulation for CT would be to operate the tube in a pulsed mode and adjust the dose via pulse width modulation.

X-ray tubes for CT systems normally operate in a continuous mode, while tubes for CV applications can also work in a pulsed mode, where the pulse width is in the order of a few milliseconds. The required on- and off-switching of the electron beam cannot be done by changing the emitter temperature accordingly, since this process is far too slow. Instead an additional grid electrode is introduced close to the emitter. The beam can then be switched off by applying a sufficiently large negative voltage to the grid electrode with respect to the emitter. The required voltage is normally in the range of several kilovolts. In principle, such a grid electrode could also be used within a CT x-ray tube to enable a pulse mode operation for dose modulation. Unfortunately the required pulse widths are then very short (10-100 microseconds) and high repetition rates of up to 20 kHz would be required. This cannot be realized with state of the art grid switch drivers and typical capacitive loads of a few hundred picofarad, arising from the grid electrode and the required high voltage cable.

The typical solution for driving a high-voltage capacitive load is to directly drive it with a switch capable of handling the high peak currents (=hard-switching). In this case the capacitive energy $E=(C*V^2)/2$ is simply dissipated inside the driving switch. The maximum operating frequency of this solution is determined by thermal limitations of the switch, and also the power supply needs to deliver this power, which is lost afterwards.

Another known way of driving a high-voltage capacitive load is by using flyback power supplies, which generates fewer losses than the hard-switching topology, but have the drawback of being less fast and taking much space.

From "Advance Soft-Switching Sinewave PWM High-Frequency Inverter-Link Cycloconverter Incorporating Voltage-Clamped Quasi-Resonant and Capacitive Snubber Techniques" of H. Yonemori and M. Nakaoka, Conference Record of the 1991 IEEE Industry Applications Society Annual Meeting in Dearborn, Mich., USA, 28 Sep.-4 Oct. 1991, power conversion circuits are known with a high-frequency AC link.

SUMMARY OF THE INVENTION

It would be desireable to provide an improved device and method for switching high-voltage of capacitive loads at high frequencies.

The invention provides a method for switching high-voltage of capacitive loads at high frequencies, a corresponding programme element and computer readable medium, and a corresponding device, high-voltage generator and examination apparatus.

It should be noted that the following described exemplary embodiments of the invention apply also for the method, the device, the programme product and the computer readable medium.

According to an exemplary embodiment there is provided a method for operating a device for high-voltage switching for driving capacitive loads, the device comprises a first input terminal and a second input terminal for applying a high voltage supply, such that a higher potential of the high-voltage supply may be applied to the first input terminal and a lower potential may be applied to the second input terminal, a first switch and a second switch, connected in series between the first input terminal and the second input terminal, a first clamping diode and a second clamping diode, connected in series and in the same blocking direction between the first input terminal and the second input terminal, such that the first clamping diode and the second clamping diode block with respect to the applied high voltage, a storage inductor, which is connected with one of its terminals to a connecting point of the both switches and with another terminal to a connecting point of the both clamping diodes, and an output terminal for connecting a capacitive load, which output terminal is connected with the connecting point of the both clamping diodes; the method comprises starting with both switches open, closing of the first switch after a first predetermined time, opening of the first switch after a second predetermined time, and closing of the second switch, after arriving a zero voltage over the second switch.

Thus, it is possible to operate a respective device with a low loss, high speed, high-voltage switch topology for capacitive loads, with high reliability for a grid switch driver. It enables fast dose modulation with high modulation depth suitable for CT applications.

Further it is possible to drive capacitive loads at high switching speeds, in which the capacitive energy is recovered and partially given back to the power supply and used for achieving zero-voltage switching. This leads to far lower power losses and heat dissipation in the switch unit and its power supply.

According to an exemplary embodiment, the first predetermined time is 10 to 100 milliseconds (ms).

According to an exemplary embodiment, the second predetermined time is 10 to 100 milliseconds (ms).

According to an exemplary embodiment the method of closing of the first switch after a first predetermined time, opening of the first switch after a second predetermined time, and closing of the second switch, after arriving a zero voltage over the second switch may be periodically repeated.

This allows to arrive at a steady state of a controlling of a respective circuit.

According to an exemplary embodiment, the storage inductor has an inductivity of 1 to 20 Milli-Henry (mH), preferably 5 to 15 mH, more preferably about 10 mH. It should be noted that the storage inductor may be selected according to the duration of the idle phase and voltage dropping over the switches during the idle phase.

According to an exemplary embodiment, a positive high-voltage of a predetermined amount is applied to the first input terminal and a negative voltage of the same predetermined amount is applied to the second input terminal.

According to an exemplary embodiment, a capacitive load is connected to ground potential.

According to an exemplary embodiment, the capacitive load is a grid of a x-ray tube.

According to an exemplary embodiment, there is provided a device for high-voltage switching for driving capacitive loads, the device comprises a first input terminal and a second input terminal for applying a high voltage supply, such that a higher potential of the high-voltage supply may be applied to the first input terminal and a lower potential may be applied to the second input terminal, a first switch and a second switch, connected in series between the first input terminal and the second input terminal, a first clamping diode and a second clamping diode, connected in series and in the same blocking direction between the first input terminal and the second input terminal, such that the first clamping diode and the second clamping diode block with respect to the applied high voltage, a storage inductor, which is connected with one of its terminals to a connecting point of the both switches and with another terminal to a connecting point of the both clamping diodes, and an output terminal for connecting a capacitive load, which output terminal is connected with the connecting point of the both clamping diodes.

According to an exemplary embodiment, a freewheeling diode is connected in parallel to each of the first switch and the second switch, such that the freewheeling diodes block with respect to the applied high voltage.

Thus, a reverse voltage on the switches may be avoided. In particular semiconductor switches are sensitive to reverse voltages so that a free-wheeling diode may avoid damages of the switches, in particular the semiconductor switches.

According to an exemplary embodiment, the storage inductor has an inductivity of 1 to 20 mH, preferably 5 to 15 mH, more preferably about 10 mH. It should be noted that the storage inductor may be selected according to the duration of the idle phase and voltage dropping over the switches during the idle phase.

According to an exemplary embodiment, at least one of the first and the second switch comprises at least two sub-switches connected in series, and at least two gate drivers, wherein each of the gate drivers is adapted to drive a gate of one of the at least two sub-switches, and each of the gate drivers has a controlling input terminal, wherein each of the controlling input terminals of a gate driver of one sub-switch is coupled with a controlling input terminal of a gate driver of a sub-switch which follows the one sub-switch in the series connection.

The sequential gate driving topology is especially suitable for high speed high-voltage cascaded switches, where extreme dV/dt's are present. It provides a reliable interference-free possibility for driving the multiple gates of the cascaded switch. Thus, a reliable well-controlled gate driving for cascaded high-voltage switches may be achieved, so that high switching speeds become possible without problems.

According to an exemplary embodiment, the controlling input terminals are inductively coupled.

An inductively coupling may be easy realized without further active components like opto-coupler or the like.

According to an exemplary embodiment, the sub-switches are semiconductor switches.

This allows a fast and reliable switching and a simple controlling of the switching process.

According to an exemplary embodiment, the sub-switches are insulated gate bipolar transistors.

It may be seen as a gist of the invention to provide a device and a method allowing to switch close to a zero voltage state at a limited voltage rise by using the parasitic capacitances of the switching elements and optionally using a storing inductor, which also may be replenished by external switching elements for a commutation of the output voltage without losses.

These and other aspects of the present invention will become apparent from and elucidated with reference to the embodiments described hereinafter.

BRIEF DESCRIPTION OF THE DRAWINGS

Exemplary embodiments of the present invention will be described in the following with reference to the following drawings.

DETAILED DESCRIPTION OF EXEMPLARY EMBODIMENTS

Figure 1:
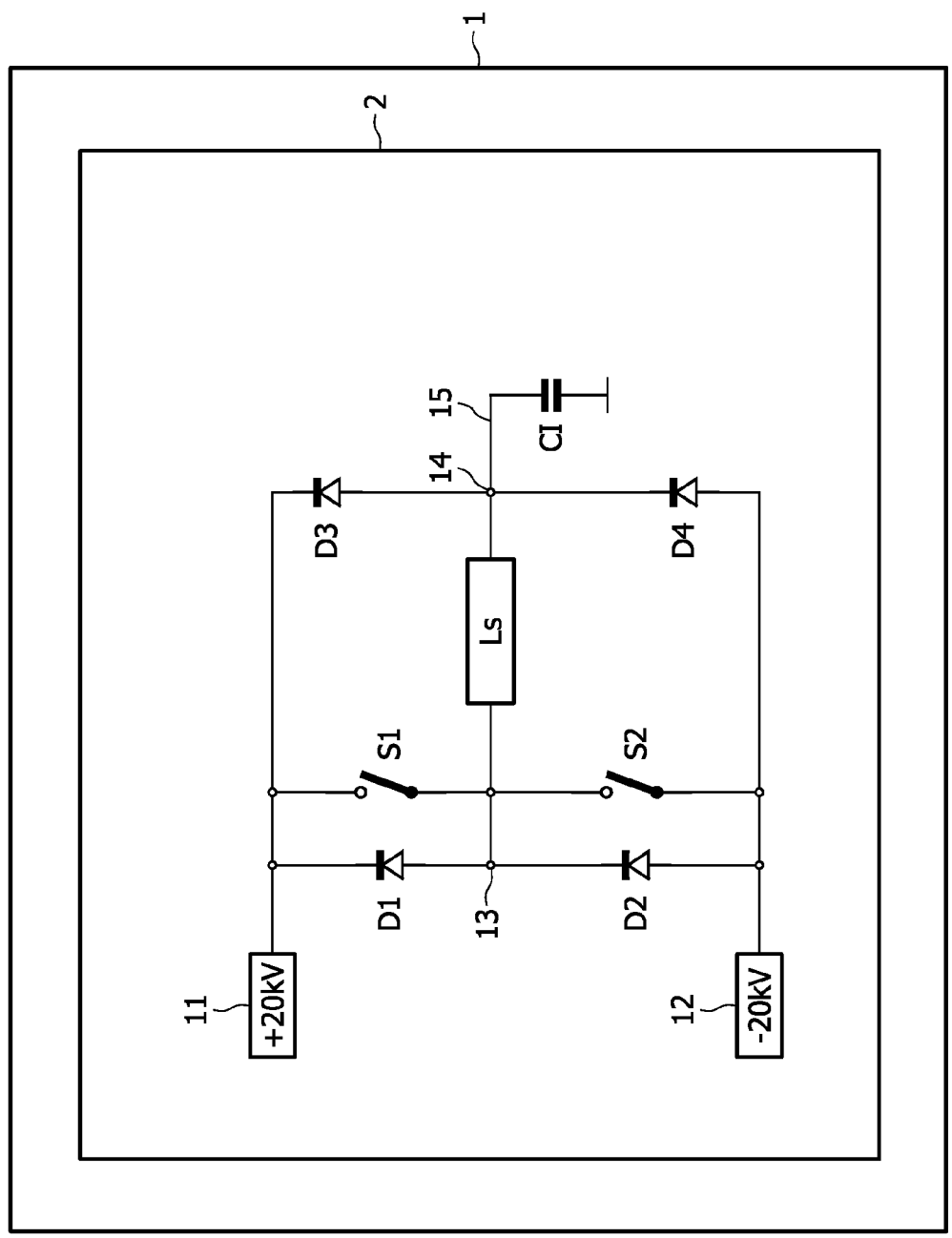
FIG. 1. illustrates a circuit according to an exemplary embodiment of the invention.

FIG. 1 gives an impression of a circuit which may be used for the operation principle of the fast high-voltage switch, in this case for example a +20 kV on a positive rail and −20 kV on a negative rail output voltage but useable for a wide range of voltages. The voltage of the high potential and the voltage of the low potential do not have to have the same amount, moreover also an asymmetric voltage may be applied. The lower potential may also be ground potential.

The circuit for high-voltage switching for driving capacitive loads may comprise a first input terminal 11 and a second input terminal 12 for applying a high voltage supply there between, such that a higher potential of the high-voltage supply may be applied to the first input terminal 11 and a lower potential may be applied to the second input terminal 12, a first switch S1 and a second switch S2, connected in series between the first input terminal 11 and the second input terminal 12, a first voltage clamping diode D3 and a second voltage clamping diode D4, connected in series and in the same blocking direction between the first input terminal 11 and the second input terminal 12, such that the first clamping diode D3 and the second clamping diode D4 block with respect to the applied high voltage, a storage inductor Ls, which is connected with one of its terminals to a connecting point 13 of the both switches S1, S2 and with another terminal to a connecting point 14 of the both clamping diodes D3, D4, and an output terminal 15 for connecting a capacitive load Cl, which output terminal 15 is connected with the connecting point 14 of the both clamping diodes D3, D4.

Further, a freewheeling diode D1, D2 may be connected in parallel to each of the first switch S1 and the second switch S2, such that the freewheeling diodes D1, D2 block with respect to the applied high voltage. The storage inductor Ls may have an inductivity in the range of 1 to 20 mH, preferably 5 to 15 mH, more preferably 10 mH.

The push-pull switch S1, S2 is followed by the energy storage inductor Ls and the two clamping diodes D3, D4, after which the capacitive load Cl may be connected. The freewheeling diodes D1, D2 may be provided anti-parallel to the switches.

The energy in the capacitive load Cl is stored in the storage inductor Ls, afterwards this energy is partially used for achieving zero-voltage switching and the remainder is given back to the power supply.

The switching process is carried out in a plurality of phases, which may be divided in four phases, which will be described with respect to the FIG. 2 to FIG. 5. The FIG. 2 to FIG. 5 give an impression on the detailed operation, as simulated with Spice for a concrete 600 pF load and a 10 mH storage inductor. For other component values the principle remains the same.

Figure 2:
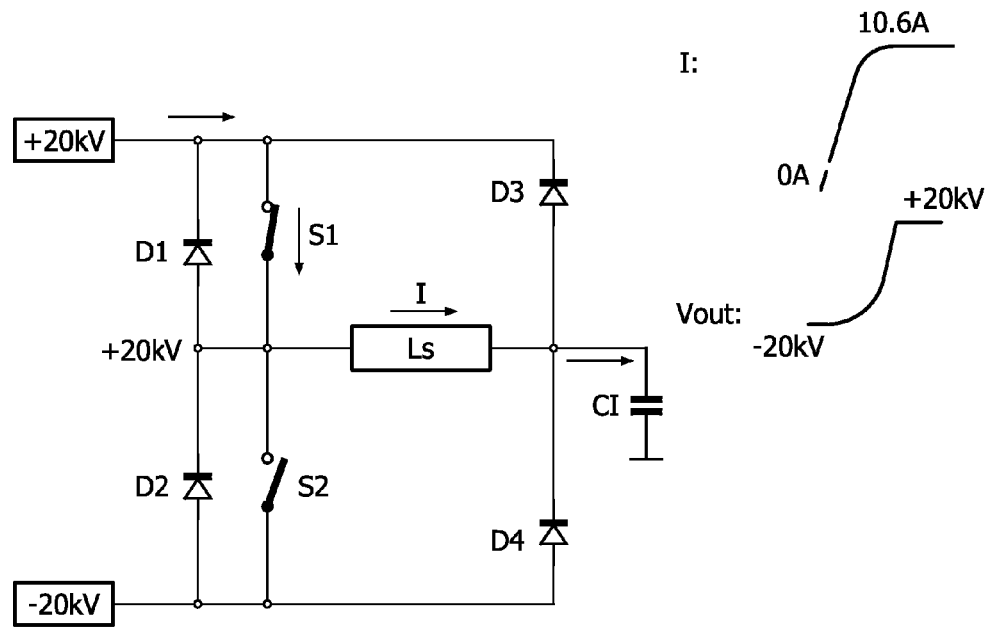
FIG. 2. illustrates a circuit according to an exemplary embodiment of the invention in a first switching phase.

During a first phase, S1 is closed and current ramps up from 0 A till Imax, e.g. 10.6 A into the load, which is lifted from e.g. −20 kV on the negative rail to e.g. +20 kV on the positive rail. This is illustrated in FIG. 2. A zero voltage switching commutation takes place (positive).

For the Ls current one can say: $dI/dt = (20\ kV - Vout)/Ls$

For Vout: $dVout/dt = I/Cl$

Figure 3:
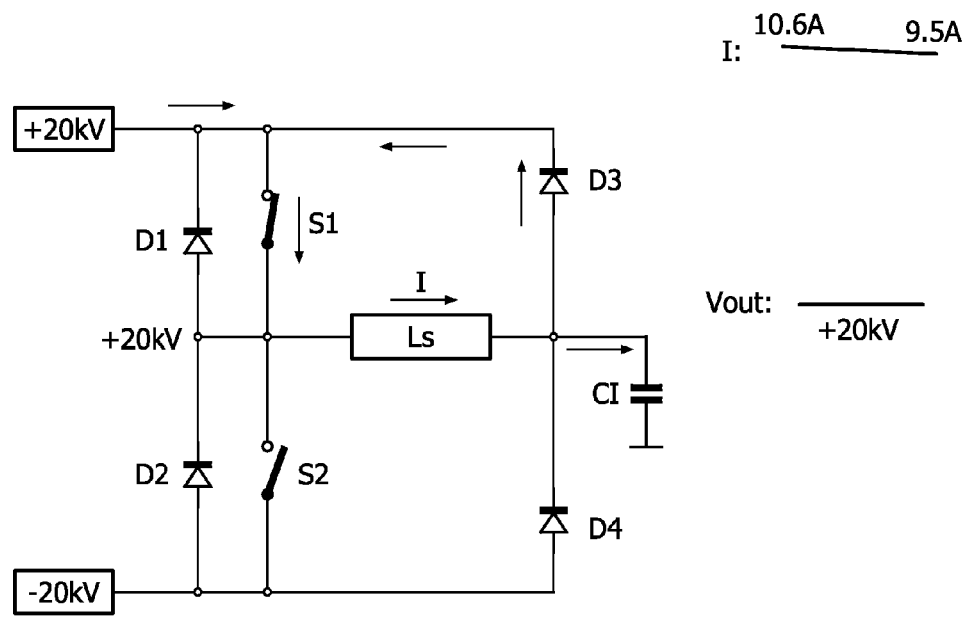
FIG. 3. illustrates a circuit according to an exemplary embodiment of the invention in a second switching phase.

As soon as the output voltage reaches e.g. +20 kV, diode D3 becomes conductive limiting the output voltage till e.g. +20 kV, in a second phase. This is illustrated in FIG. 3. This is a steady state (positive). The duration thereof corresponds to the exposure interval, i.e. the x-ray is switched on.

The storage inductor current keeps running through the closed circuit of D3 and S1, only ramping down slowly due to the forward voltage of D3 following the rule:

$$dI/dt = -Vf\_D3/Ls$$

During the whole of the second phase the output voltage remains constant at +20 kV.

Figure 4:
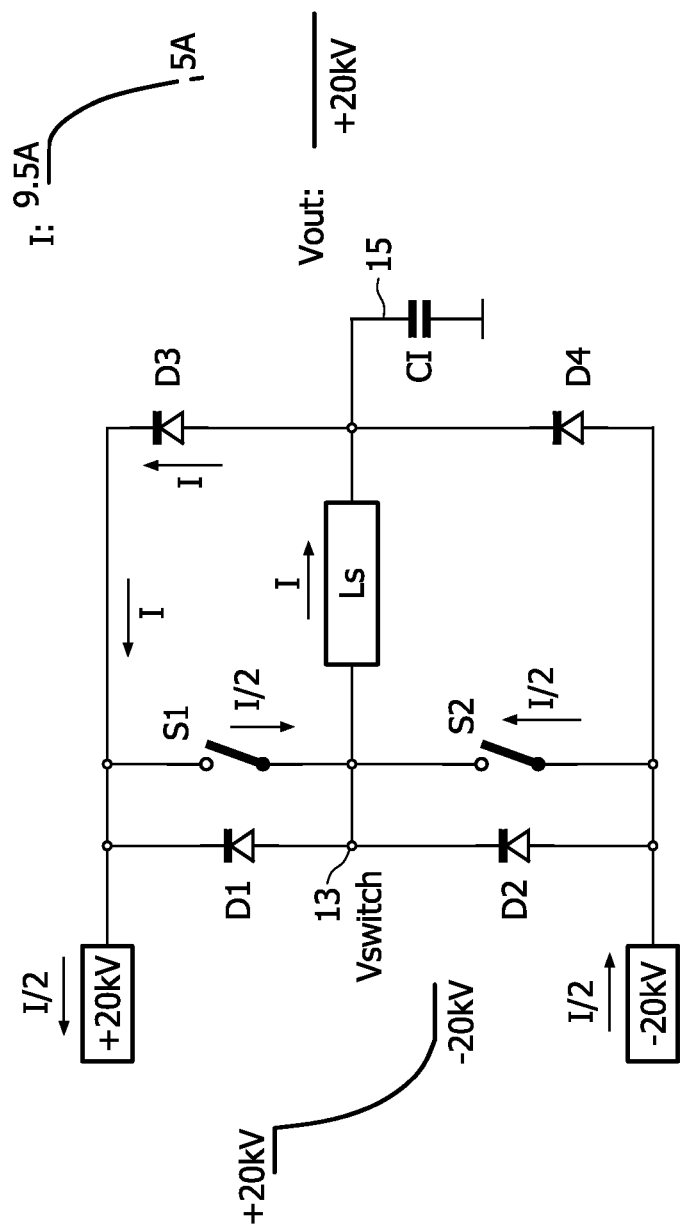
FIG. 4. illustrates a circuit according to an exemplary embodiment of the invention in a third switching phase.

As soon as S1 opens, a third phase starts. This is illustrated in FIG. 4.

The storage inductor current is now used to achieve zero-voltage switching, by charging the parasitic switch capacitances. The switch voltage drops from +20 kV to −20 kV with both switches S1, S2 still open, while Vout at the output terminal 15 stays constant and the storage inductor current follows the rule:

$$dI/dt = (Vswitch - Vout)/Ls$$

When Vswitch at the connecting point 13 between the both switches S1, S2 reaches −20 kV, diode D2 becomes conductive and S2 is closed, without any switching losses because the voltage over S2 was almost zero (only D2 forward voltage) at the moment of closure.

Figure 5:
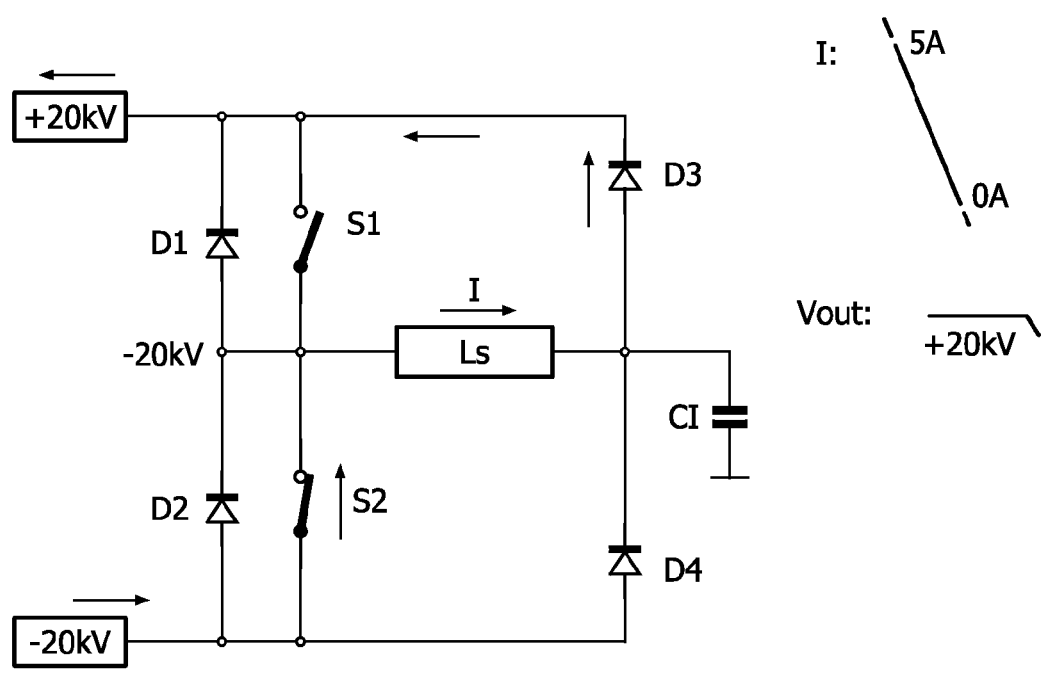
FIG. 5. illustrates a circuit according to an exemplary embodiment of the invention in a forth switching phase.

After S2 is closed, a forth phase starts. A zero voltage commutation takes place (negative). This is illustrated in FIG. 5. Afterwards a steady state (negative) is reached. The duration thereof corresponds to a switch off time of an x-ray.

The remaining storage inductor current is now rendering energy to the power supply through S2 and D3. This current is ramping down according:

$$dI/dt = -40\ kV/Ls$$

Vout remains at +20 kV until the complete storage inductor energy has been rendered to the power supply (current is zero). After that the first phase recommences, but in the other direction.

The commutation time of the zero voltage switching state typically ranges from 100 ns to 1 µs. The commutation of the output voltage at capacitive load Cl is typically below 2 µs. In a state without a commutation the inductor current will be decomposed over semiconductor devices. The state is conductive with respect to the current till the current is decomposed in the inductor. If the current is decomposed, a particular charge is stored in the capacitive load Cl in form of, e.g. a grid capacity for an x-ray apparatus.

At high operating frequencies, the capacitive energy recovered into the storage inductor Ls is for the largest part used for achieving zero voltage switching (hence reducing the switch losses) and for recovery by the power supply (reducing supply power). At low frequencies, zero-voltage switching is no longer achieved (storage inductor Ls is empty at the moment of switching), but the peak power stress on the switch is still much lower than in the hard-switching case because now zero-current switching is obtained (the switch only has to switch its own parasitic capacitances, but the load capacitance is isolated from the switch by the storage inductor). At low frequencies the average power loss is still somewhat lower than at high operating frequencies, because the higher switching energy is multiplied by a lower frequency:

$$Ploss = Esw * Freq$$

The components may be dimensioned such that for each load/output voltage situation the minimum power losses may be obtained in function of the desired frequency range.

The complete switch unit may be build up in a compact way, because the storage inductor and clamping diodes are compact, and the switch has lower losses so that heat sinks take less space.

Figure 6:
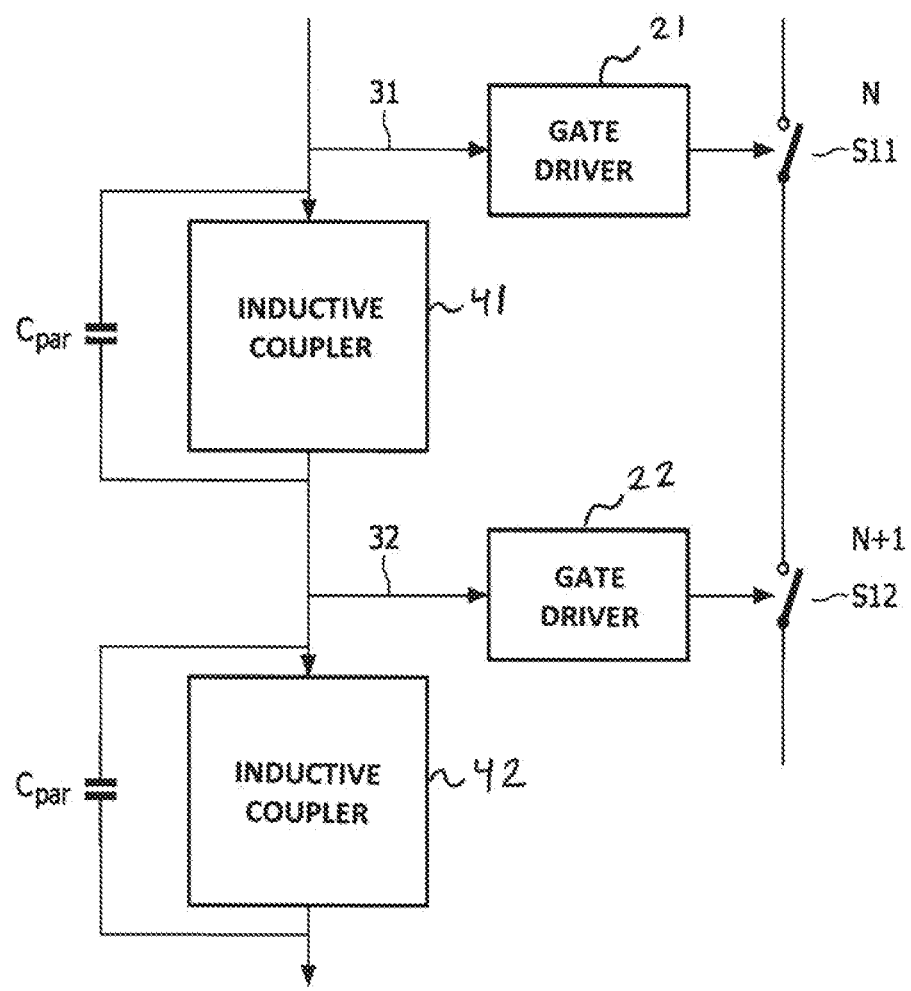
FIG. 6. illustrates a sub-circuit according to an exemplary embodiment of the invention.

FIG. 6 describes a sub-circuit according to an exemplary embodiment of the invention.

FIG. 6 illustrates in particular a fast high-voltage switch build up for driving capacitive loads.

The circuit comprises illustrates the sub-switches of at least one of switches S1 or S2. At least one of the first and the second switch S1, S2 comprises at least two sub-switches S11, S12 connected in series, and at least two gate drivers 21, 22, wherein each of the gate drivers is adapted to drive a gate of one of the at least two sub-switches S11, S12, and each of the gate drivers 21, 22 has a controlling input terminal 31, 32, wherein each of the controlling input terminals of a gate driver of one sub-switch is coupled 41, 42 with a controlling input terminal of a gate driver of a sub-switch which follows the one sub-switch in the series connection.

The circuit topology in principal allows to reach the required specifications for a fast grid-switch driver. The switches may be realized as a cascaded series connection of multiple semiconductor switches, since each of them cannot withstand the required high switching voltages. Furthermore, the cascaded series connection of multiple semiconductor drivers provides less capacitive coupling capacitance and thus, a faster switching can be achieved. The gate driving of such a cascaded high voltage switch is a difficult task and leads to reach the required switching speed.

Typically cascaded high-voltage switches are driven by opto-couplers or transformers, which are referenced to ground at the control side. This has the drawback of a high dV/dt seen by the parasitic capacitance of the opto-coupler or transformer, generating a high peak current at the moment of switching, so that undesired on/off effects or oscillations can occur if the switching speed is increased too much. The controlling input terminals may be inductively coupled, so that no further active elements would be necessary.

The number of switches is dependent of the total voltage to be switched. Each switch may be a MOSFET, IGBT or other semiconductor switch element. Each switch may have a gate driver delivering the peak current for its gate.

Each gate driver is driven not directly via a ground-referenced coupling device, but via a coupling device that is driven by its previous switch. In doing so, the parasitic capacitance (Cpar) of the coupling device placed in the worst case position (driving the switch connected to the output) is seeing N (number of switches) times less dV/dt than what a ground-referenced coupling device would see. This results in N times less peak current through Cpar, so that the gate driver will perform much more reliably at high switching speeds. At N times more peak current, parasitic on/off switching or oscillations can occur at high dV/dt.

FIG. 6 shows an inductive coupler used for interconnecting the gate drivers, but also other coupling devices are possible (such as transformers or opto-couplers). However the inductive coupler has the advantage of a very high speed (e.g. 10 ns typical propagation delay), a very compact size (e.g. SO8 housing) and a very low parasitic capacitance. Its limited isolation voltage is no problem in this sequential setup, which would not be the case in a ground-referenced driving scheme (isolation voltage must be equal to output voltage Vout). In the sequential topology the required isolation voltage is only $V\text{out}/N$.

The worst case dV/dt seen by the gate driver coupling device is N (number of cascaded switches) times lower than in a ground-referenced system. The isolation voltage needed for this coupling device is N times less than in a ground-referenced system. This makes the use of much higher switching speeds and the use of compact high speed coupling devices possible. Thus, a fast grid switch driver for x-ray tubes is possible and would enable fast dose modulation in CT systems via pulse width modulation.

Figure 7:
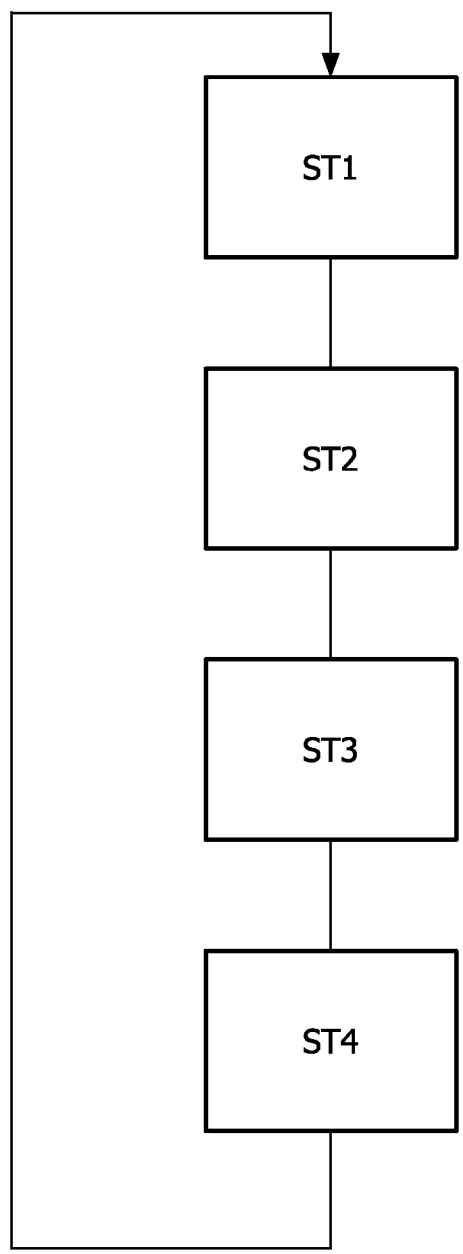
FIG. 7 illustrates a flow chart of an exemplary embodiment of the present invention.

FIG. 7 illustrates a flow chart of an exemplary embodiment of the present invention. In particular, FIG. 7 illustrates opening ST1 of both switches S1, S2, closing ST2 of the first switch S1 after a first predetermined time, opening ST3 of the first switch S1 after a second predetermined time and closing ST4 of the second switch S2, after arriving a zero voltage over the second switch. The above procedure may be periodically repeated. It should be noted that ST1, ST2, ST3 and ST4 do not have to correspond with the first phase, the second phase, the third phase and the forth phase, respectively, described above.

It should be noted that the invention may be applied to build a fast grid switch driver for x-ray tubes. Such a fast driver would enable fast dose modulation in CT systems via pulse width modulation.

It should be noted that the term 'comprising' does not exclude other elements or steps and the 'a' or 'an' does not exclude a plurality. Also elements described in association with the different embodiments may be combined.

It should be noted that the reference signs in the claims shall not be construed as limiting the scope of the claims.

The invention claimed is:

1. A device configured for switching for driving capacitive loads, the device comprising:
   a first input terminal, and a second input terminal, for applying a voltage supply, such that a higher potential of said supply is applicable to the first input terminal and a lower potential is applicable to the second input terminal;
   a first switch and a second switch, connected in series between the first input terminal and the second input terminal;
   a first clamping diode and a second clamping diode, connected in series and in the same blocking direction between the first input terminal and the second input terminal, such that the first clamping diode and the second clamping diode block with respect to the applied voltage;
   a storage inductor, which is connected with one of its terminals to a connecting point of both switches and with another terminal to a connecting point of both clamping diodes; and
   an output terminal for connecting a capacitive load, which output terminal is connected with the connecting point of both clamping diodes,
   said device further configured for periodically repeating an actuation sequence of the switches so as to modulate a duty cycle of said load.

2. The device of claim 1, wherein the storage inductor has an inductivity greater than 1 and less than 20 millihenries (mH).

3. The device of claim 2, wherein the storage inductor has an inductivity of at least 5 and less than 15 millihenries (mH).

4. The device of claim 1, said first input terminal having a positive high-voltage of a predetermined amount, said second input terminal having a negative voltage of the same predetermined amount.

5. The device of claim 1, said capacitive load being connected to ground potential.

6. The device of claim 1, said capacitive load being a grid of an x-ray tube.

7. The device of claim 1, further comprising a freewheeling diode connected in parallel to each of the first switch and the second switch, such that the freewheeling diodes block with respect to the applied voltage.

8. The device of claim 1, further configured such that said sequence entails opening of said first switch that causes current from said inductor to be used to charge a parasitic capacitance of said second switch to thereby afford switching at merely a forward voltage of a diode connected in parallel with said second switch.

9. The device of claim 1, further configured such that said sequence entails opening of said first switch that reroutes current flow onto said first input terminal to regenerate said supply, the rerouting partially diverting from said flow to send current over said first switch.

10. The device of claim 1, further configured for, in performing said sequence, charging, via continued flow of a current through said inductor, respective parasitic capacitances of said first and second switches to avoid power loss from said second switch that would otherwise occur upon closing said second switch.

11. The device of claim 1, said sequence comprising:
   closing of the first switch: a) to, with both switches open, start the sequence; or b) a first predetermined time after both switches are open as a result of the actuating;
   opening of the first switch a second predetermined time after the closing;
   closing of the second switch, after a voltage over the second switch is reduced to a forward voltage of diode connected in parallel with said second switch; and
   opening both switches as a result of said actuating.

12. The device of claim 11, wherein the first predetermined time is greater than 10 and less than 100 milliseconds (ms).

13. The device of claim 11, wherein the second predetermined time is greater than 10 and less than 100 milliseconds (ms).

14. The device of claim 11, further configured such that said closing causes current to flow to said first input terminal via said first clamping diode.

15. The device of claim 1, said switching comprising high-voltage switching and said voltage supply comprising a high-voltage supply.

16. A high-voltage generator comprising the device of claim 15 for said high-voltage switching.

17. The device of claim 1, the modulating comprising performing pulse width modulation.

18. The device of claim 1, the modulating comprising modulating an electron beam.

19. The device of claim 1, the modulating comprising modulating an X-ray beam.

20. The device of claim 1, further configured for controlling an X-ray exposure interval of said device via the modulating.

21. A computed tomography (CT) system comprising the device of claim 1 for X-ray dose modulation.

22. A device configured for high-voltage switching for driving capacitive loads, the device comprising:
   a first input terminal and a second input terminal for applying a high voltage supply, such that a higher potential of the high-voltage supply is applicable to the first input terminal and a lower potential is applicable to the second input terminal;
   a first switch and a second switch, connected in series between the first input terminal and the second input terminal;
   a first clamping diode and a second clamping diode, connected in series and in the same blocking direction between the first input terminal and the second input terminal, such that the first clamping diode and the second clamping diode block with respect to the applied high voltage;
   a storage inductor, which is connected with one of its terminals to a connecting point of both switches and with another terminal to a connecting point of both clamping diodes; and
   an output terminal for connecting a capacitive load, which output terminal is connected with the connecting point of both clamping diodes,
   wherein at least one of the first switch and the second switch comprises at least two sub-switches connected in series; and at least two gate drivers, wherein each of the gate drivers is configured for driving a gate of one of the at least two sub-switches, and each of the gate drivers has a controlling input terminal; wherein each of the controlling input terminals of a gate driver of one sub-switch is coupled with a controlling input terminal of a gate driver of a sub-switch which follows the one sub-switch in the series connection.

23. The device of claim 22, wherein the controlling input terminals are inductively coupled.

24. The device of claim 22, wherein the sub-switches are semiconductor switches.

25. The device of claim 22, wherein the sub-switches are insulated gate bipolar transistors.

26. A device configured for switching for driving capacitive loads, the device comprising:
   a first input terminal, and a second input terminal, for applying a voltage supply, such that a higher potential of said supply is applicable to the first input terminal and a lower potential is applicable to the second input terminal;
   a first switch and a second switch, connected in series between the first input terminal and the second input terminal;
   a first clamping diode and a second clamping diode, connected in series and in the same blocking direction between the first input terminal and the second input terminal, such that the first clamping diode and the second clamping diode block with respect to the applied voltage;
   a storage inductor, which is connected with one of its terminals to a connecting point of both switches and with another terminal to a connecting point of both clamping diodes; and
   an output terminal for connecting a capacitive load, which output terminal is connected with the connecting point of both clamping diodes,
   said device further configured for periodically repeating an actuation sequence of the switches so as to modulate a duty cycle of said load,
   said sequence comprising:
   closing of the first switch: a) to, with both switches open, start the sequence; or b) a first predetermined time after both switches are open as a result of the actuating;
   opening of the first switch a second predetermined time after the closing;
   closing of the second switch, after a voltage over the second switch is reduced to a forward voltage of diode connected in parallel with said second switch; and
   opening both switches as a result of said actuating,
   said device implemented as part of a computed tomography (CT) scanner, the modulating comprising dynamically varying the predetermined times with a dimension of a cross-section of a subject of interrogation by said scanner.

* * * * *